United States Patent
Kamo et al.

(10) Patent No.: US 6,589,063 B2
(45) Date of Patent: Jul. 8, 2003

(54) ELECTRIC CONTACT DEVICE FOR ESTABLISHING AN IMPROVED CONTACT WITH CONTACTORS OF OTHER DEVICE

(75) Inventors: Yoshitaka Kamo, Tokyo (JP); Hiroaki Tosa, Tokyo (JP); Tatsushi Higashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/793,701

(22) Filed: Feb. 27, 2001

(65) Prior Publication Data

US 2002/0025698 A1 Feb. 28, 2002

(30) Foreign Application Priority Data

Aug. 29, 2000 (JP) ........................ 2000-258580

(51) Int. Cl.[7] .............................................. H01R 11/22
(52) U.S. Cl. ...................................................... 439/268
(58) Field of Search ................................ 439/268, 263, 439/70, 841

(56) References Cited

U.S. PATENT DOCUMENTS 3,774,143 A * 11/1973 Lopin ........................ 439/268
4,040,697 A * 8/1977 Ramsay et al. ............. 439/268
4,072,388 A * 2/1978 Dunn .......................... 439/268
4,655,526 A * 4/1987 Shaffer ....................... 439/268
5,154,626 A * 10/1992 Watson ....................... 439/268
6,027,356 A * 2/2000 Wright ....................... 439/268

FOREIGN PATENT DOCUMENTS

JP          05-144497        11/1993

* cited by examiner

Primary Examiner—Javaid Nasri
(74) Attorney, Agent, or Firm—McDermott, Will & Emery

(57) ABSTRACT

There are provided an electric contact device for establishing reliable contact with ball contactors or strip contactors of a semiconductor device over contact areas of great area; a semiconductor device test socket using the electric contact device; a semiconductor module using the electric contact device; and a semiconductor device test method. A contact lead having a ring-shape or helical section is provided between a support pole and a movable pole. The movable pole is moved, to thereby bring the contact lead into an expanded state in which the diameter of the ring-shape or helical section becomes larger. A contactor is inserted into the ring-shape or helical section. The contact lead is then brought into a contacted state such that the diameter of the ring-shape or helical section becomes smaller, wherewith the contact lead is wrapped around the periphery of the contactor.

16 Claims, 11 Drawing Sheets

ELECTRIC CONTACT DEVICE FOR ESTABLISHING AN IMPROVED CONTACT WITH CONTACTORS OF OTHER DEVICE

BACKGROUND OF THE INVENTION

1. Field of the Invention

The present invention relates to an electric contact device for establishing electric contact with contactors or contact elements of other devices such as a semiconductor device. The present invention further relates to a semiconductor device test socket using the contact device, to a semiconductor module using the contact device, and to a method of testing a semiconductor device.

2. Background Art

Some semiconductor devices, such as semiconductor integrated circuits, use ball grid array (BGA) contactor system. The ball grid array contactor system is embodied by means of arranging a plurality of ball-type contactors on one surface of a package having a semiconductor chip encapsulated therein. Respective ball contactor is connected to corresponding electrodes of the semiconductor chip encapsulated in the package and act as external terminals.

A test socket is used at a time of testing of such a semiconductor device. Further, when a semiconductor device is mounted on a circuit board such as a printed board, a semiconductor module mounting a semiconductor device on a mount socket is used. An electric contact device for establishing electric contact with respective contactor of a semiconductor device is built into the test socket or the semiconductor module.

FIGS. 22 through 24 shows examples of conventional electric contact devices of such a type. The drawings illustrate a conventional contact mechanism to be brought into contact with a single ball contactor or contact element. As shown in FIG. 22, the contact mechanism is embodied by means of a ball contactor 1 being pinched between a pair of strip contact leads 2A and 2B. In the example shown in FIG. 23, the contact leads 2A and 2B are positioned at diametrically opposite ends of the contactor 1 so as to mutually oppose. In the example shown in FIG. 24, the contact leads 2A and 2B are positioned so as to become offset with reference to the diameter of the contactor 1, in order to prevent inadvertent and faulty contact, which would otherwise arise between the contact lead 2A of one ball contactor 1 and the contact lead 2B of an adjacent ball contactor 1.

Theoretically, the ball contactor 1 comes into point contact with the contact leads 2A and 2B. However, when the ball contactor 1 becomes deformed, the ball contactor 1 comes into plane contact with the contact leads 2A and 2B. In view of a reduction in contact resistance, plane contact is preferable, and in order to attain this the ball contactor 1 must be deformed. If the ball contactor 1 is brought into reliable contact with the contact lead without involvement of deformation, contact resistance increases. Bringing contact leads into reliable contact with a ball contactor is not compatible with reducing contact resistance. As things stand now, one of these must be sacrificed.

The present invention was attained in consideration of the present circumstances, and proposes a new electric contact device having an improved contact mechanism capable of bringing contact leads into reliable contact with a contactor over a larger contact area while reducing contact resistance.

The present invention also proposes a new semiconductor device test socket having an improved contact mechanism capable of bringing contact leads into reliable contact with a contactor over a larger contact area while reducing contact resistance.

The present invention also proposes a new semiconductor module having an improved contact mechanism capable of bringing contact leads into reliable contact with a contactor over a larger contact area while reducing contact resistance.

The present invention also proposes a new method of testing a semiconductor device by utilization of an improved contact mechanism capable of bringing contact leads into reliable contact with a contactor over a larger contact area while reducing contact resistance.

SUMMARY OF THE INVENTION

According to one aspect of the present invention, an electric contact device comprises a contact mechanism having a contact lead, a drive mechanism for the contact lead, and an electric circuit for supplying an electric potential required by the contact lead of the contact mechanism. The contact mechanism has a contact lead, and the contact lead has a support end and a movable end, and is formed from elastic conductive material so as to constitute a ring-shape section therebetween. The drive mechanism moves the movable end of the contact lead of the contact mechanism. Herein, the drive mechanism moves the movable end such that the annular section of the contact lead of the contact mechanism enters an expanded state and assumes a larger diameter; a contactor is inserted into the ring-shape section while the contact lead remains in an expanded state; and the contact lead comes into contact with the contactor while entering a contracted state such that the ring-shape section assumes a smaller diameter.

According to another aspect of the present invention, an electric contact device comprises a plurality of contact mechanisms which are spaced apart from each other and placed on a base plate, each contact mechanism having a contact lead, and the contact lead having a support end and a movable end and being formed from elastic conductive material so as to constitute a ring-shape section therebetween. A drive mechanism is provided for commonly moving the movable ends of the contact leads of the contact mechanisms; and an electric circuit is provided for supplying an electric potential required by the contact leads of the contact mechanisms. Herein, the drive mechanism moves the movable ends of the contact leads of the contact mechanisms such that the ring-shape sections enter an expanded state and assume a larger diameter; contactors are inserted into the respective ring-shape sections while the contact leads remain in an expanded state; and the contact leads come into contact with the contactors while entering a contracted state such that the ring-shape sections assume a smaller diameter.

According to another aspect of the present invention, an electric contact device comprises first and second contact mechanisms which are spaced apart from each other and placed on a base plate, each of the first and second contact mechanisms having a contact lead, and the contact lead having a support end and a movable end and being formed from elastic conductive material so as to constitute a ring-shape section therebetween.

A drive mechanism is provided for commonly moving the movable ends of the contact leads of the first and second contact mechanisms; and an electric circuit is provided for supplying an electric potential required by the contact leads of the first and second contact mechanisms. Herein, the drive mechanism moves the movable ends of the contact leads of the first and second contact mechanisms such that the ring-shape sections enter an expanded state and assume a larger diameter; contactors are inserted into the respective ring-shape sections while the contact leads remain in an expanded state; and the contact leads come into contact with the contactors while entering a contracted state in which the ring-shape sections assume a smaller diameter.

Other features and advantages of the invention will be apparent from the following description taken in connection with the accompanying drawings.

DETAILED DESCRIPTION OF THE PREFERRED EMBODIMENTS

Figure 1:
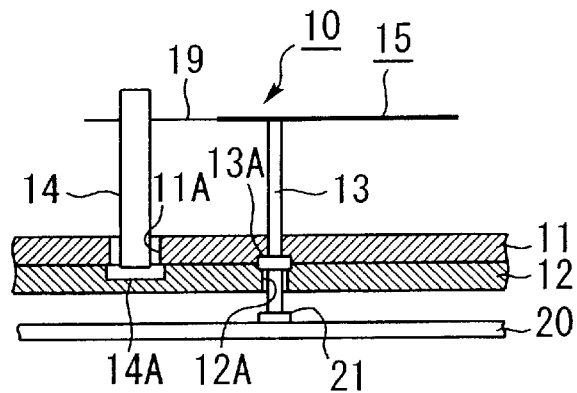
FIG. 1 is a side view shown partially in cross section, showing an electric contact device according to a first embodiment of the present invention.

Preferred embodiments of the present invention are now described in detail with reference to the accompanying drawings. In the drawings, same or corresponding parts are given the same reference numerals and the descriptions may be simplified or omitted.

First Embodiment

Figure 2:
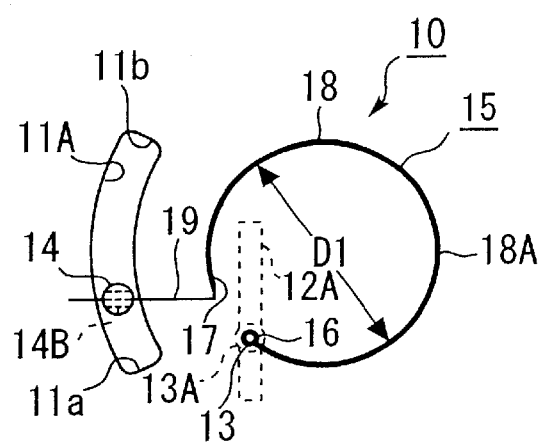
FIG. 2 is a top view of the electric contact device shown in FIG. 1.

FIG. 1 is a side view shown partially in cross section, showing an electric contact device according to a first embodiment of the present invention. FIG. 2 is a top view of the electric contact device shown in FIG. 1. A contact mechanism 10 is built on two overlapping base plates 11 and 12. FIG. 1 shows the base plates 11 and 12 in cross section. The contact mechanism 10 has a support pole 13, a movable pole 14, and a contact lead 15. The contact lead 15 is formed from an elastic wire of, for example, copper or aluminum. The contact lead 15 has a support end 16 and a movable end 17, and is bent so as to constitute an ring-shape section 18 extending between the ends 16 and 17. The support end 16, the movable end 17 and the ring-shape section 18 are formed within a plane which is parallel with the upper surface of the base plates 11 and 12. The ring-shape section 18 is formed partially from an annular portion 18A.

The support pole 13 is disposed perpendicular to and penetrates through the base plates 11 and 12. A collar 13A is attached to the support pole for stopping purpose and is interposed between the base plates 11 and 12. The support pole 13 is rotatable about its center relative to the base plates 11 and 12. The movable pole 14 penetrates through and extends to the base plate 11 at right angles with a collar 14A sandwiched between the base plates 11 and 12. A guide groove 11A into which the movable pole 14 fits is formed in the base plate 11 in a circular-arch shape. The center of the circular-arch guide groove 11A is located at a position near the center of the ring-shape section 18.

The support end 16 of the contact lead 15 is fixed on the support pole 13, and the movable end 17 is fixed to a connecting line 19. The connecting line 19 passes through a hole 14B formed in the movable pole 14 so as to diametrically penetrate through the movable pole 14. As the movable pole 14 travels along the guide groove 11A, the movable end 17 of the contact lead 15 also moves. The connecting line 19 and the movable pole 14 are mutually slidable. In association with travel of the movable pole 14, the connecting line 19 is slidable in its longitudinal direction within the hole 14B while remaining held therein.

Although the base plate 11 is stationary, the base plate 12 is movable in the vertical direction with reference to the paper plane of FIG. 1. The base plate 12 is actuated by means of a predetermined drive mechanism in the direction perpendicular to the paper plane of FIG. 1. A clearance groove 12A into which the support pole 13 fits is formed in the base plate 12. When the base plate 12 moves in the direction perpendicular to the paper plane of FIG. 1, the clearance groove 12A allows movement of the base plate 12, which would otherwise be hindered by the support pole 13. The support pole 13 comes into contact with a wire 21 laid on a circuit board 20 at a position lower than the base plates 11 and 12. A predetermined potential is applied to the contact lead 15 from an electric circuit by way of the contact with the wire 21. Here, the potential corresponds to, for example, a supply voltage or a ground potential.

Figure 3:
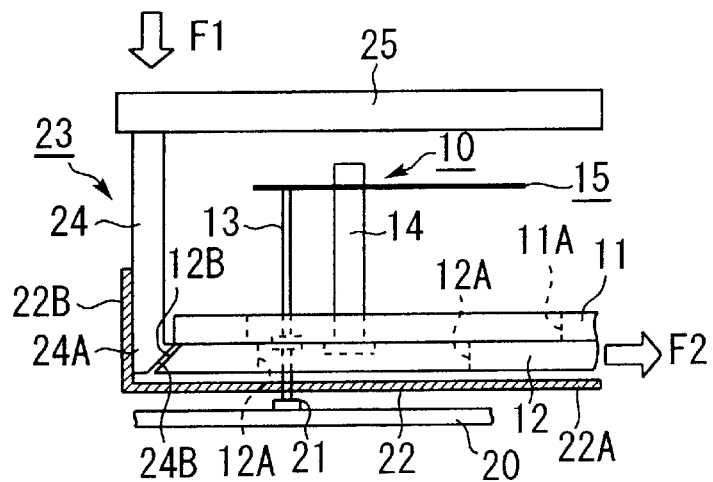
FIG. 3 is a side view shown partially in cross section as viewed from right hand side of FIG. 2, showing the electric contact device including a drive mechanism.

FIG. 3 is a side view shown partially in cross section as viewed from right hand side of FIG. 2, showing the electric contact device including a drive mechanism for actuating the base plate 12. The electric contact device has a lower case 22, and the lower case 22 is shown in cross section. The lower case 22 comprises a bottom portion 22A located below the base plates 11 and 12, and a side wall portion 22B extending upright from the edge of the bottom potion 22A. The drive mechanism 23 further includes an actuation plate 24 which can move vertically relative to the base plate 12 while being guided along the interior surface of the side wall portion 22B. A lower portion of the actuation plate 24 is formed into a plate portion 24A so as to extend to a position in the vicinity of the edge of the base plate 12. The edge of the base plate 12 is tapered so as to constitute a tapered surface 12B, and a tapered surface 24B is formed in the plate portion 24A so as to oppose the tapered surface 12B in substantially a parallel manner. When the actuation plate 24 is pushed in the direction indicated by arrow F1, the tapered surface 24B comes into contact with the tapered surface 12B, thereby imparting force to the tapered surface 12B in the direction indicated by arrow F2. The base plate 12 is eventually actuated horizontally in the direction designated by arrow F2. Reference numeral 25 designates an upper case.

FIGS. 1 and 2 show the electric contact device which is in a stationary state. As can be seen from FIG. 2, a movable pole 17 is situated in a position relatively close to an end 11a of the guide groove 11A while the electric contact device remains stationary. The inside diameter of the ring-shape section 18 when the electric contact device is in a stationary state is assigned D1.

Figure 4:
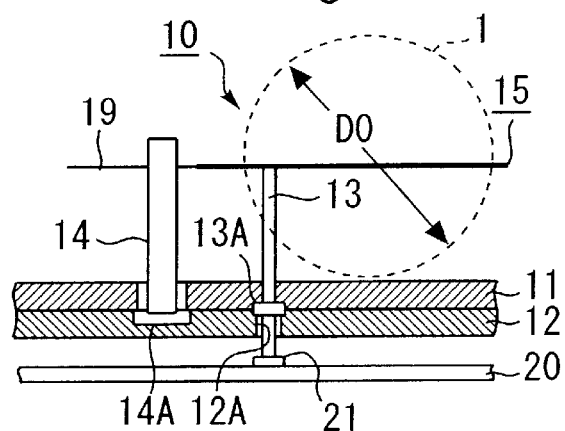
FIGS. 4 and 5 show the electric contact device according to the first embodiment while in an expanded state.
Figure 5:
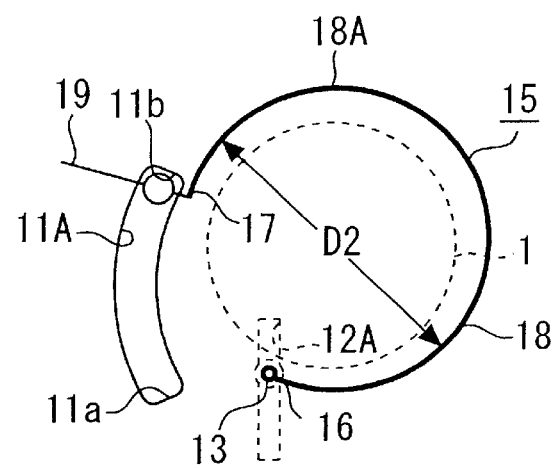
Figure 6:
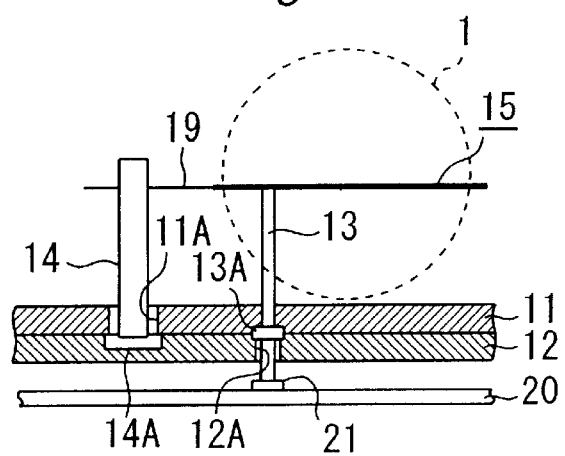
FIGS. 6 and 7 show the electric contact device according to the first embodiment while in a contracted state.
Figure 7:
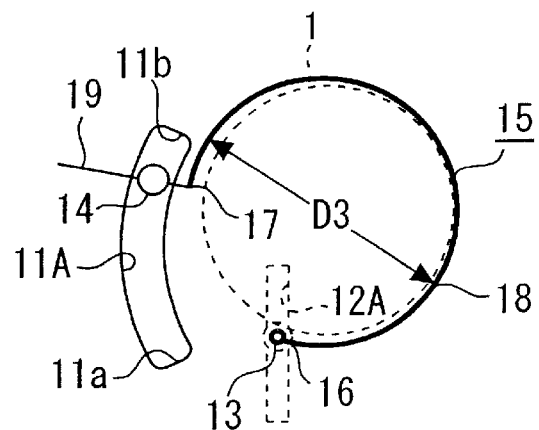

FIGS. 4 and 5 show the electric contact device according to the first embodiment while in an expanded state, whilst FIGS. 6 and 7 show the electric contact device while in a contracted state. FIGS. 4 and 6 are side elevation views corresponding to FIG. 1, and FIGS. 5 and 7 are top views corresponding to FIG. 2. More specifically, FIGS. 4 and 5 show the ring-shape section 18 of the contact lead 15 which is in an expanded state. Provided that the inside diameter of the thus-expanded ring-shape section 18 is taken as D2, the ring-shape section 18 is set such that D2 indicated by dotted lines becomes greater than an outside diameter D0 of a ball contactor 1 or ball-shape contact element 1; that is, D2>D0. The ball contactor 1 is fitted into the thus-expanded ring-shape section 18. While the electric contact device remains in an expanded state, the base plate 12 is pushed in the direction perpendicular to the paper plane of FIGS. 1 and 4. The movable pole 14 is located at the end 11b of the guide groove 11A, and the movable end 17 expands the diameter of the ring-shape section 18. The outside diameter D0 of the contactor 1 corresponds to the diameter of the contactor 1 taken along a plane which is parallel to the base plates 11 and 12 and imparts the maximum outside diameter to the ball contactor 1; namely, the outside diameter D0 is equal to the diameter of the ball contactor 1.

FIGS. 6 and 7 show the ring-shape section 18 of the contact lead 15 in a state closer to fully contracted state than to the fully expanded state. The inside diameter of the thus-contracted ring-shape section 18 is taken as D3 and is substantially equal to the outside diameter D0 of the ball contactor 1. In this state, as a result of contraction of the ring-shape section 18, the ring-shape section 18 is in contact with the ball contactor 1 so as to encircle the exterior surface of the ball-like contactor 1 along a great circle thereof. The contracted state appears during the course of transformation of the ring-shape section 18 from the expanded state shown in FIGS. 4 and 5 to the stationary state of the electric contact device shown in FIGS. 1 and 2. In other words, the contracted state corresponds to a state in which the ring-shape section 18 is wrapped around the contactor 1. In a contracted state, the force exerted on the base plate 12 is released. In conjunction with release of the force, the ring-shape section 18 enters a contracted state during the course of the base plate 12 returning to a stationary state.

In a contracted state, the ring-shape section 18 wraps around the periphery of the ball contactor 1 under elasticity and at predetermined force. Accordingly, the ring-shape section 18 comes into contact with substantially the entire periphery of the ball contactor 1 while the ball contactor 1 remains intact, thus sufficiently reducing contact resistance.

When the ball contactor 1 is present on the exterior surface of a semiconductor device package, a required potential is imparted to the contactor 1 while the ring-shape section 18 is in a contracted state, whereby a semiconductor device can be subjected to a required test. Further, a required potential is applied to a semiconductor device, thereby enabling a semiconductor device to fulfill desired functions. In any event, stable contact can be established without involvement of deformation of the ball contactor 1, thereby sufficiently reducing contact resistance.

During the course of the ring-shape section 18 changing from a stationary state to an expanded state and further to a contracted state, the movement of the contact lead 15 is smoothed by means of the mechanism in which the support pole 13 rotates about the axis thereof as well as by means of the construction in which the connecting line 19 slides in the hole 14B of the movable pole 14. As a result, there maybe yielded an advantage of contact between the contact lead 15 and the contactor 1 being improved and an advantage of a reduction in a chance of metal fatigue arising in the contact lead 15. Thus, the electric contact device can assume a construction which sufficiently withstands repeated contacting action.

Second Embodiment

Figure 8:
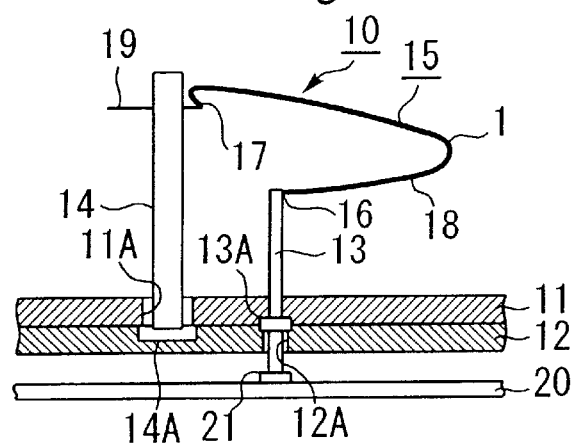
FIG. 8 is a side view shown partially in cross section, showing an electric contact device according to a second embodiment of the present invention.

FIG. 8 is a side view shown partially in cross section, showing an electric contact device according to a second embodiment of the present invention. In the first embodiment, the contact lead 15 is constructed such that the ring-shape section 18, the support end 16, and the movable end 17 are situated within a plane parallel to the base plates 11 and 12. In contrast, in the second embodiment, the contact lead 15 is constructed such that the support end 16 is positioned so as to differ in level from the movable end 17 with reference to the base plates 11 and 12. The ring-shape section 18 extends from the support end 16 to the movable end 17 so as to assume a substantially helical construction.

In the second embodiment, when the ring-shape section 18 is in a contracted state, the support end 16 is situated in a lower position and the movable end 17 is situated in a higher position, relative to the plane which is parallel with the base plates 11 and 12 and defines the maximum diameter of the ball contactor 1. The contact lead 15 comes into contact with and obliquely surrounds the periphery of the contactor 1, thereby reducing contact resistance to a much greater extent. In other respects, the electric contact device according to the second embodiment is identical in construction with that described in connection with the first embodiment.

Third Embodiment

Figure 9:
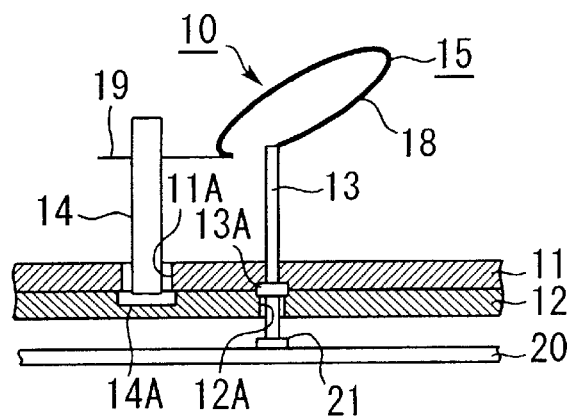
FIG. 9 shows an electric contact device according to a third embodiment of the present invention.

FIG. 9 shows an electric contact device according to a third embodiment of the present invention. In the third embodiment, the support end 16 and the movable end 17 of the contact lead 15 are situated within a plane parallel to the base plates 11 and 12. The ring-shape section 18 is constructed in a plane which obliquely crosses the plane parallel to the base plates 11 and 12. As in the case of the second embodiment, there is an advantage of a reduction in contact resistance. In other respects, the electric contact device according to the third embodiment is identical in construction with that described in connection with the first embodiment.

Fourth Embodiment

Figure 10:
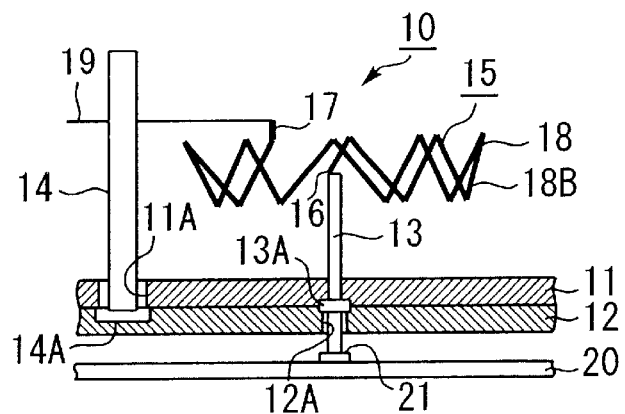
FIG. 10 shows an electric contact device according to a fourth embodiment of the present invention.

FIG. 10 shows an electric contact device according to a fourth embodiment of the present invention. In the fourth embodiment, the contact lead 15 has an angularly corrugated portion 18B which encircles the periphery of the ball contactor 1. In a state in which the ring-shape section 18 is contracted and in contact with the periphery of the ball contactor 1, the angularly corrugated portion 18B is in contact with the periphery in an angularly corrugated pattern, thus increasing the area of a contact surface. As in the case of the second and third embodiments, contact resistance can be diminished.

Fifth Embodiment

Figure 11:
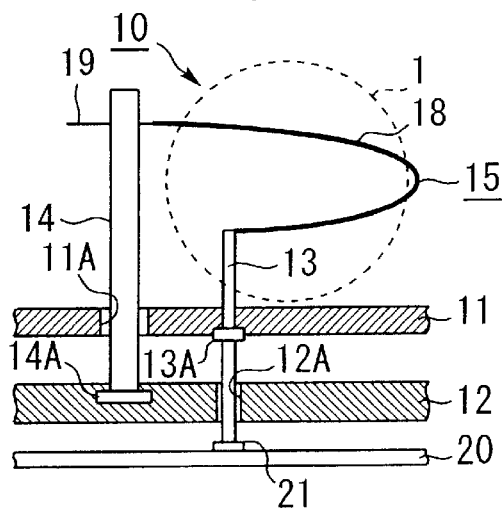
FIG. 11 shows an electric contact device according to a fifth embodiment of the present invention.

FIG. 11 shows an electric contact device according to a fifth embodiment of the present invention. In the present embodiment, when in a stationary state, the electric contact device is identical with that shown in FIGS. 1 and 2. When in an expanded state shown in FIGS. 4 and 5 and in a contracted state shown in FIGS. 6 and 7, the electric contact device is constructed such that the movable end 17 is raised so as to depart from the base plates 11 and 12. When in a contracted state in which the ring-shape section 18 is in contact with the ball contactor 1, the electric contact device can come into contact with the ball contactor 1 in the same manner as in the second embodiment. Therefore, contact resistance can be reduced, as in the case of the second embodiment.

Figure 12:
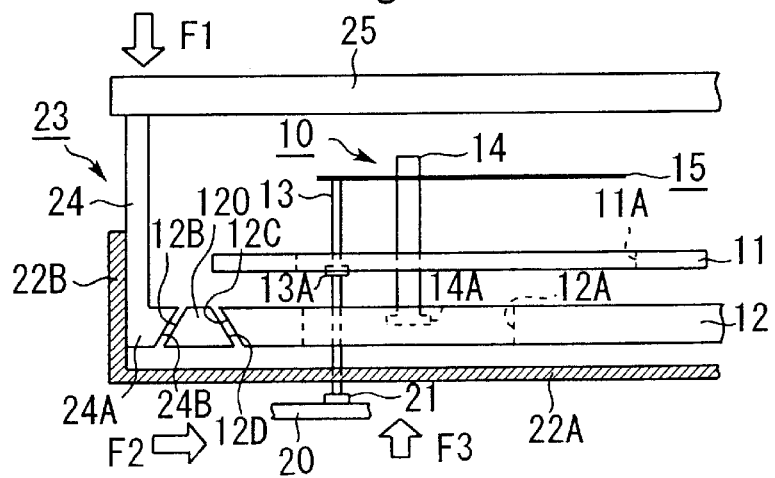
FIG. 12 shows a drive mechanism of the electric contact device according to the fifth embodiment.

In the fifth embodiment, the base plate 12 is spaced apart from and disposed parallel to the base plate 11, and is constructed so as to be able to move vertically. FIG. 12 shows a drive mechanism for driving the base plate 12. In the present embodiment, a movable plate 120 is disposed in a space by way of which the plate portion 24A of the drive plate 24 opposes the base plate 12. One side of the movable plate 120 is formed into a tapered surface 12B which opposes the tapered surface 24B, and the other side of the movable plate 120 is formed into a tapered surface 12D which opposes a tapered surface 12C formed on the end of the base plate 12. When lowering force F1 is exerted on the actuation plate 24, the tapered surface 24B comes into contact with the tapered surface 12B, thereby imparting force F2 to the base plate 12. The tapered surface 12D comes into contact with the tapered surface 12C, thereby imparting raising force F3 to the base plate 12. By means of forces F2 and F3, the movable pole 13 is raised while traveling toward the end 11b of the guide groove 11A. When returning to the end 11a from the end 11b, the movable pole 13 is lowered in association with returning action.

In the fifth embodiment, the collar 14A of the movable pole 14 is embedded in the base plate 12, and the movable pole 14 moves vertically in association with vertical motion of the base plate 12.

Sixth Embodiment

Figure 13:
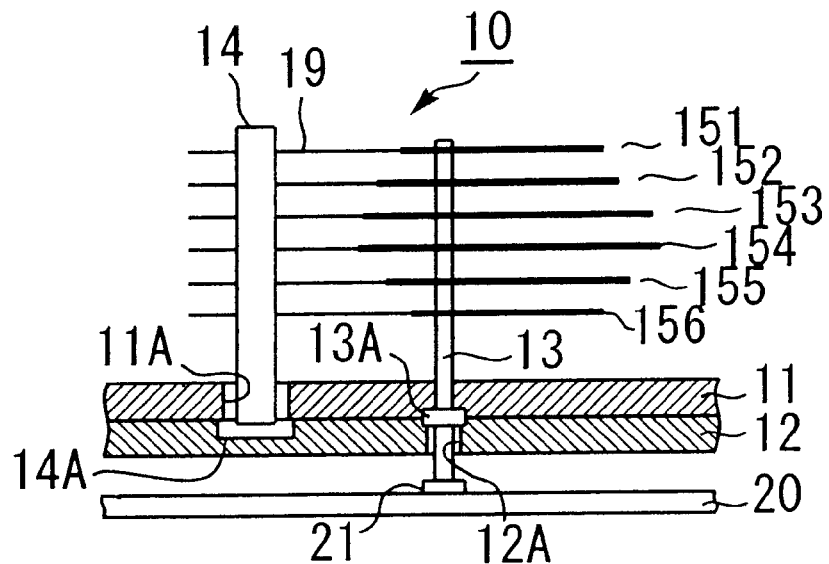
FIG. 13 shows an electric contact device according to a sixth embodiment.

FIG. 13 shows an electric contact device according to a sixth embodiment. In the first through fifth embodiments, the contact mechanism 10 constituted of the single contact lead 15 is employed. In the present embodiment, there is employed a contact mechanism 10 having a plurality of contact leads interposed between the support rod 13 and the movable pole 14. In the example shown in FIG. 13, the contact mechanism 10 has six contact leads 151, 152, 153, 154, 155, and 156 provided between the support rod 13 and the movable 14. Each of the contact leads 151 through 156 is constructed such that a support end, a movable end, and an annular section are positioned within a plane parallel to the base plates 11 and 12, as in the case of the contact lead 15 employed in the first embodiment. The six contact leads 151 through 156 are placed in respective planes which are parallel to one another.

The six contact leads 151 through 156 are formed such that, when in a stationary state such as that shown in FIGS. 1 and 2, respective inside diameters of the contact leads 151 through 156 differ from the inside diameter D1 of the ring-shape section 18. In the example shown in FIG. 13, when in a stationary state, the top contact lead 151 and the bottom contact lead 156 assume a single inside diameter; that is, D11. When in a stationary state, the second contact lead 152 from the top and the second contact lead 155 from the bottom assume a single inside diameter; that is, D12. Similarly, when in a stationary state, the third contact lead 153 from the top and the third contact lead 154 from the bottom assume a single inside diameter; that is, D13. There is a relationship of D13>D12>D11. The support pole 13 and the movable pole 14 are common among the contact leads 151 through 156. Respective support ends of the contact leads 151 through 156 are engaged with the support pole 13, and respective movable ends of the same are engaged with the movable pole 14, in the same manner as in the first embodiment.

In the sixth embodiment, when in an expanded state, the contact leads 151 through 156 are expanded such that the inside diameters D11 to D13 become greater than the outside diameter D0 of the ball contactor 1. In this state, the ball contactor 1 is inserted into the respective contact leads 151 through 156. When changing from the expanded state to a contracted state, the respective contact leads 151 through 156 are wrapped around the periphery of the ball contactor 1, thus establishing electric contact. Since a plurality of contact leads come into contact with corresponding areas on the periphery of the ball contactor 1, deformation of the ball contactor 1 is suppressed, thus sufficiently diminishing contact resistance.

Seventh Embodiment

Figure 14:
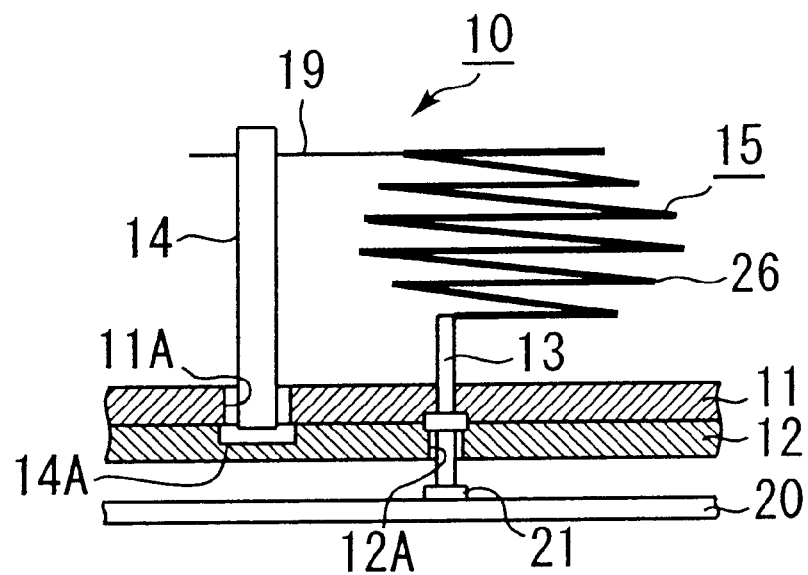
FIG. 14 shows an electric contact device according to a seventh embodiment of the present invention.

FIG. 14 shows an electric contact device according to a seventh embodiment of the present invention. In the present embodiment, the plurality of contact leads 151 through 156 employed in the sixth embodiment are replaced with a single contact lead 15 having a helical section 26. The support end 16 and the movable end 17 of the contact lead 18 are provided so as to differ in level from each other with reference to the base plates 11 and 12. In the contact lead 15, the helical section 26 is provided between the support end 16 and the movable end 17, and the helical section 26 is analogous in shape to a coil spring. In order to enable an internal spiral edge of the helical section 26 to come into contact with the ball contactor 1, as in the sixth embodiment, the top and bottom coils of the helical section 26 assume a smaller inside diameter, and a center portion of the helical section 26 assumes a larger inside diameter.

More specifically, the helical section 26 according to the present embodiment is expanded such that the inside diameters of coils of the helical section 26 including the inside diameters of the top and bottom coils become greater than the maximum diameter of the ball contactor 1. In this expanded state, the ball contactor 1 is inserted into the helical section 26. When changing from the expanded state to a contracted state, the entire inside edge of the helical section 26 comes into contact with the periphery of the contactor 1, thus attaining low contact resistance without involvement of deformation of the ball contactor 1.

Eighth Embodiment

Figure 15:
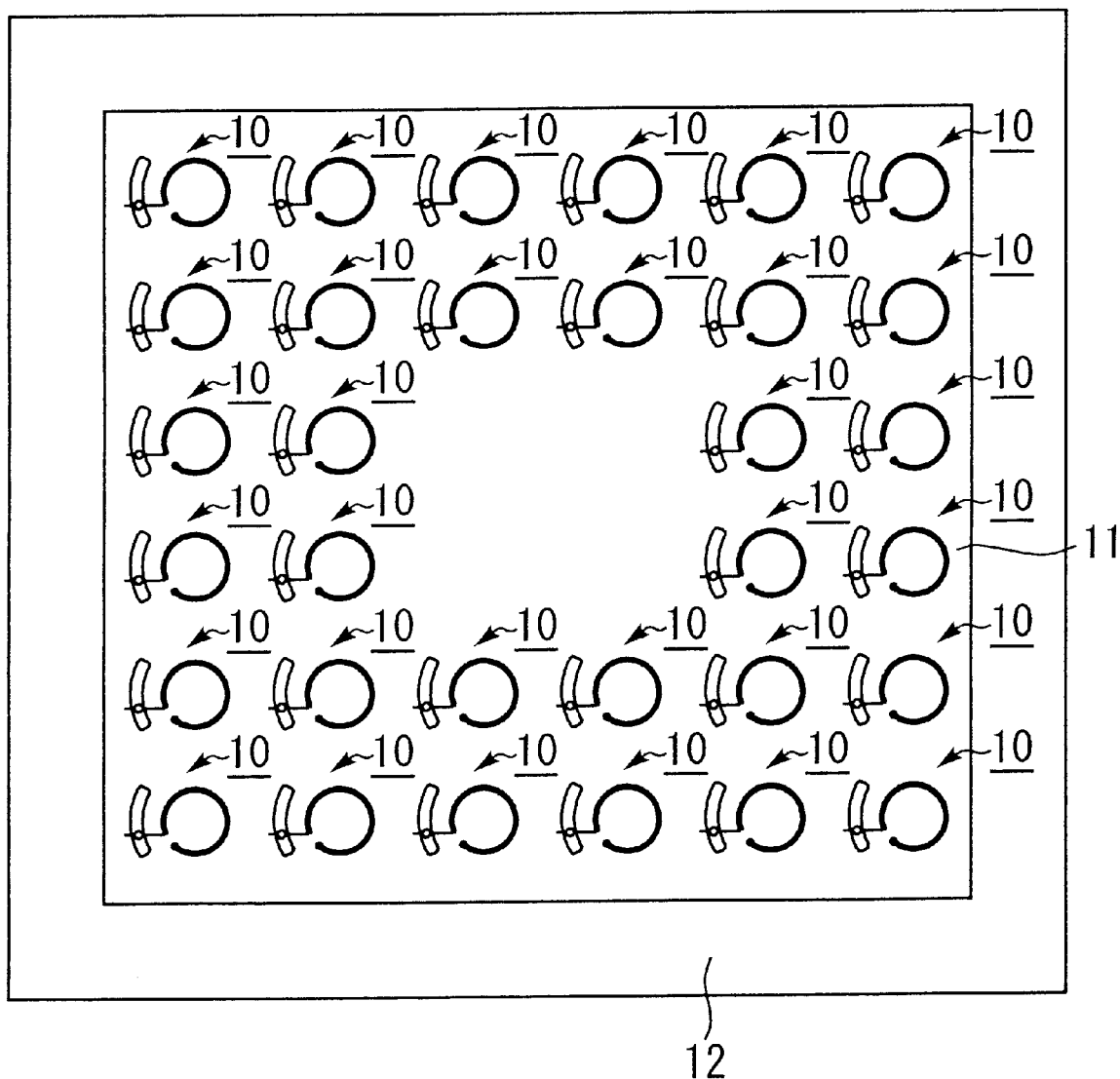
FIGS. 15 and 16 show an electric contact device according to an eighth embodiment of the present invention.
Figure 16:
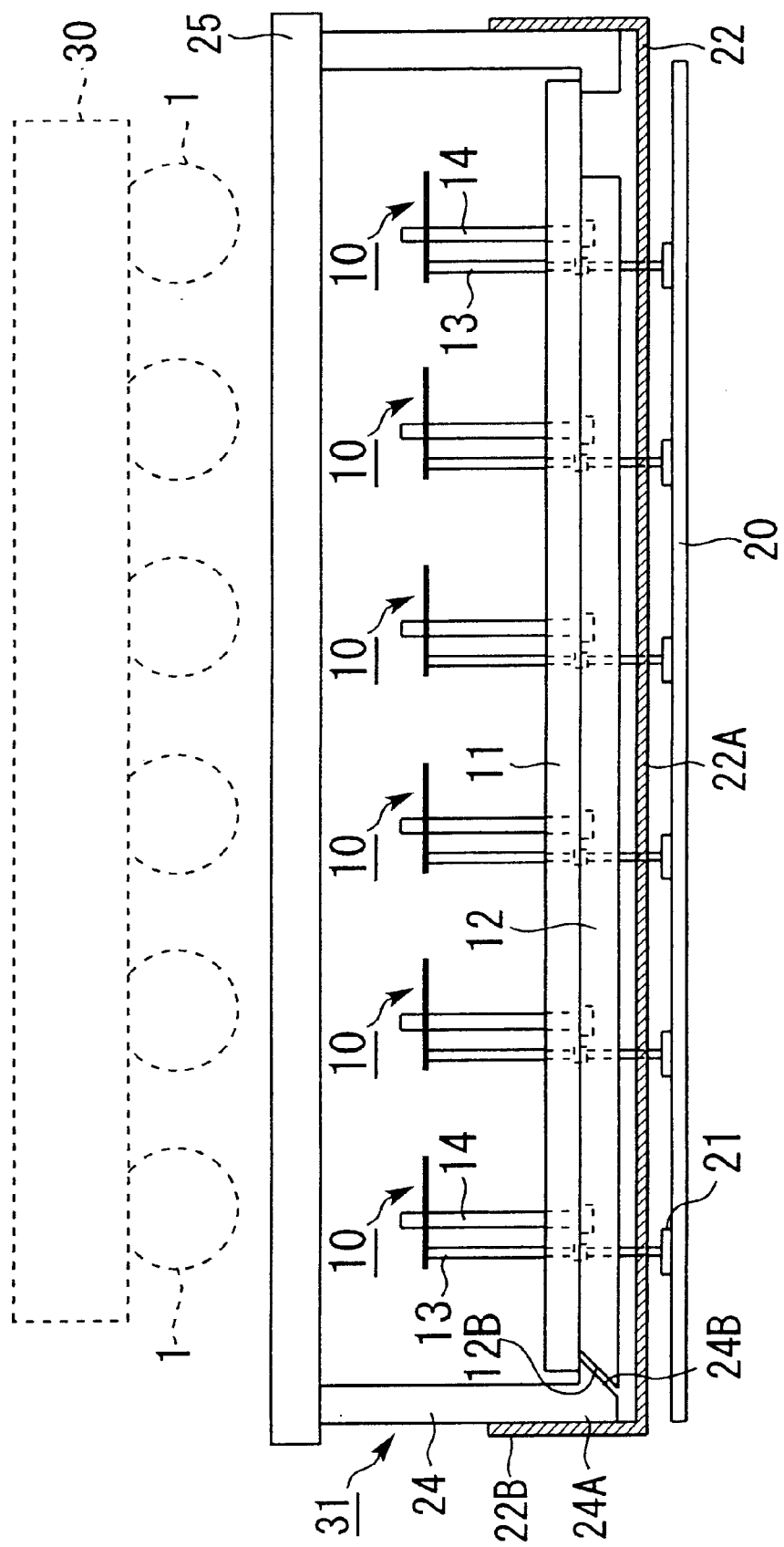

FIGS. 15 and 16 show an electric contact device according to an eighth embodiment of the present invention. The present embodiment is directed toward an embodiment of a semiconductor device test socket according to the present invention as well as toward a semiconductor module according to the present invention.

In the present embodiment, a plurality of contact mechanisms 10 are used. Each of the contact mechanisms 10 corresponds to the contact mechanism described in connection with, for example, the first embodiment. The contact mechanisms 10 are disposed on the base plates 11 and 12. A semiconductor device 30 is shown in an upper area of FIG. 16 and is indicated by dotted lines. A plurality of ball contactors 1 are formed on the lower surface of the semiconductor device 30. The ball contactors 1 are connected to respective electrodes of a chip. The layout of the ball contactors 1 provided on the semiconductor device 30 matches the layout of the contact mechanisms 10 provided on the base plates 11 and 12. In other words, contact mechanisms 10 equal in number to the ball contactors 1 are placed in positions corresponding to the respective ball contactors 1.

The lower case 22 shown in FIGS. 3 and 6 corresponds to a lower case of a socket 31 allocated to the semiconductor device 30. The socket 31 constitutes a test socket to be used for testing of the semiconductor device 30. In a case where a mount socket is used in combination with the semiconductor device 30, to thereby construct a semiconductor module, the mount socket corresponds to the socket 31.

The socket 31 has an upper case 25 and the lower case 22, and the base plates 11 and 12 are provided within the side wall 22B of the lower case. The actuation plate 24 of the drive mechanism 23 has a frame structure so as to fit on the interior surface of the side wall 22B. The actuation plate 24 is constructed so as to move vertically while being guided by the interior surface of the side wall 22B. The upper case 25 constitutes an enclosure, and the semiconductor device 30 is placed in the socket 31 by means of opening the upper case 25. After insertion of the semiconductor device 30, the upper case 25 is pushed, to thereby press the semiconductor device 30 into the socket 31. During the course of the semiconductor device 30 being pressed, the actuation plate 24 actuates the base plate 12, thereby bringing the contact leads 15 of the respective contact mechanisms 10 into an expanded state. In association with expansion of the contact leads 15, the ball contactors 1 are gradually inserted into the contact leads 15. When the contact leads 15 remain in an expanded state, the ball contactors 1 are situated inside the respective contact leads 15. Next, the pressing force exerted on the upper case 25 is released. During the course of resuming their original state under spring restoration force, the respective contact leads 15 enter a contracted state and are wrapped around the peripheries of the ball contactors 1. Thus, the respective contact mechanisms 10 establish contact with the ball contactors 1.

In a case where the semiconductor device 30 is subjected to a test, the socket 31 is utilized as a test socket. A required electric potential is supplied to the contact leads 15 of the contact mechanisms 10 by way of the respective wires 21 laid on the printed board 20. A required output is acquired from one of the wires 21, thus testing the semiconductor device 30.

In a case where a semiconductor module is constituted, the socket 31 is utilized as a mount socket, thereby activating the semiconductor device 30 so as to perform a predetermined function. In this case, an electric potential required for activating the semiconductor device 30 is supplied to the wires 21 laid on the circuit board 20, and the result of operation is output as a predetermined output signal from a certain wire 21.

Ninth Embodiment

Figure 17:
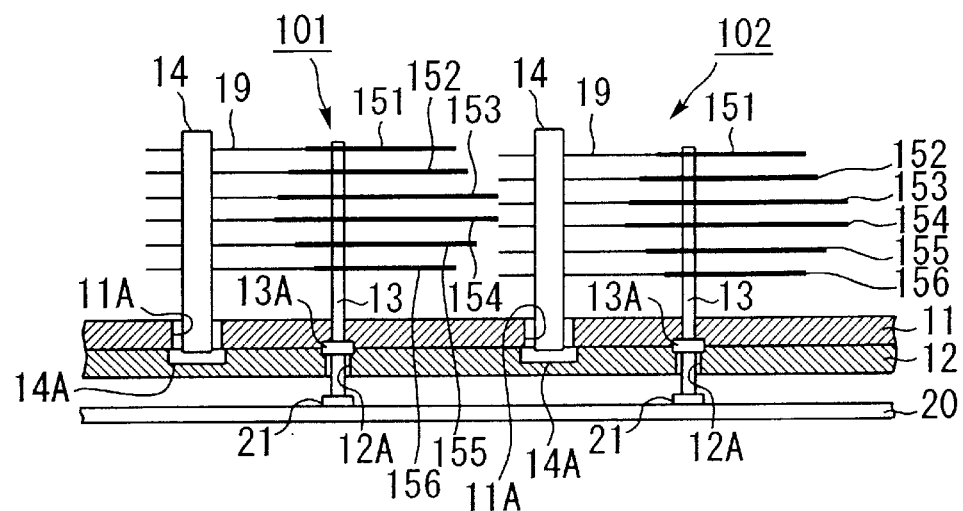
FIGS. 17 and 18 illustrate an improved electric contact device according to a ninth embodiment of the present invention.
Figure 18:
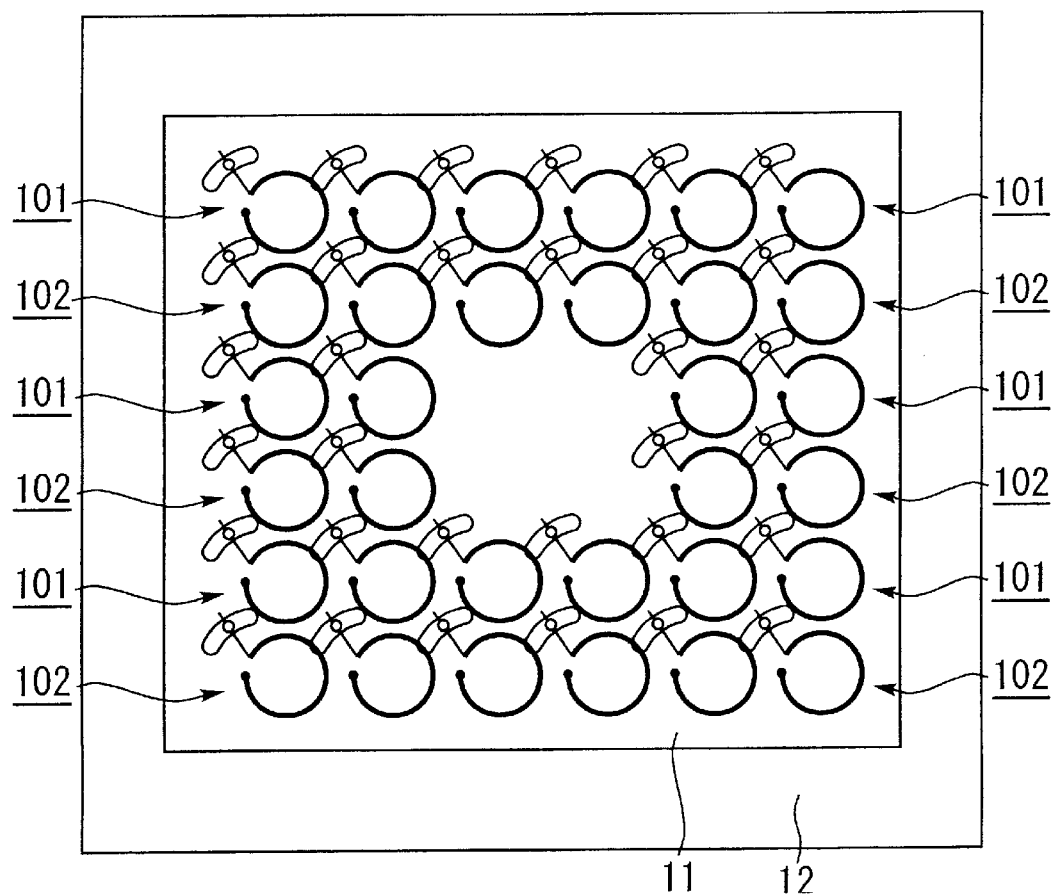

FIGS. 17 and 18 illustrate an improved electric contact device according to a ninth embodiment of the present invention, wherein the device is based on the electric contact device described in connection with the eighth embodiment. Each of the contact mechanisms 10 employed in the present embodiment is formed from the contact mechanism 10 shown in FIG. 13. The contact mechanisms 10 are arranged while being classified into two categories; that is, first contact mechanisms 101 and second contact mechanisms 102. In a layout of contact mechanisms shown in FIG. 18, the first contact mechanisms 101 are arranged in odd rows, and the second mechanisms 102 are arranged in even rows. FIG. 17 shows two contact mechanisms 101 and 102 which are adjacent to each other.

Both the contact mechanisms 101 and 102 are identical with the contact mechanism 10 shown in FIG. 13. Levels of contact leads of the contact mechanisms 101 and 102 are adjusted such that the contact leads 151 through 156 of the first contact mechanism 101 and the contact leads 151 through 156 of the second contact mechanism 102 are arranged in a staggered format when viewed in cross section. For example, the contact lead 151 of the second contact mechanism 102 is located between the contact leads 151 and 152 of the first contact mechanism 101.

By means of such a construction, the first and second contact mechanisms 101 and 102 can be arranged more closely to one another. In association with a reduction in pitch between the ball contactors 1 of the semiconductor device 30, the required area of the semiconductor device 30 and that of the socket 31 can be reduced.

Tenth Embodiment

Figure 19:
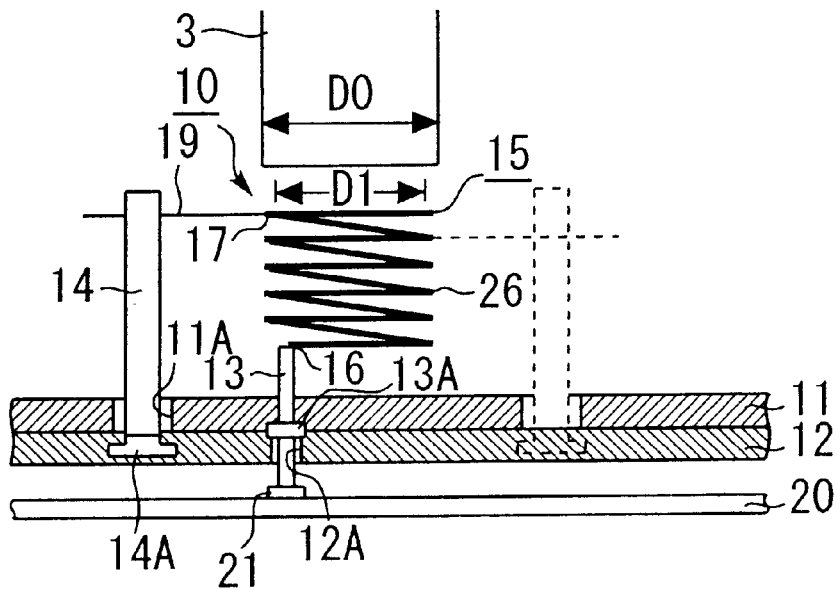
FIG. 19 shows an electric contact device according to a tenth embodiment of the present invention.

FIG. 19 shows an electric contact device according to a tenth embodiment of the present invention for use with a strip contactor 3 (or strip contacting element 3) in lieu of the ball contactor 1. The strip contactor 3 is used for a semiconductor device 30 employing a package construction of, for example, a QFP (Quad Flat Package). The strip contactor 3 is formed by means of punching a flat plate called a lead frame into a predetermined pattern. In a QFP, a plurality of strip contactors 3 are attached to each side of a rectangular semiconductor device.

FIG. 19 shows a single contact mechanism 10 assigned to a single strip contactor 3. Although the contact mechanism 10 is analogous to that shown in FIG. 14, the helical section 26 assumes the shape of a cylindrical coil spring. Hence, the helical section 26 has a single inside diameter throughout. FIG. 19 shows a stationary state of the helical section 26 corresponding to that shown in FIGS. 1 and 2. In the stationary state, the helical section 26 assumes inside diameter D1, which is smaller than the width D0 of the strip contactor 3.

Figure 20:
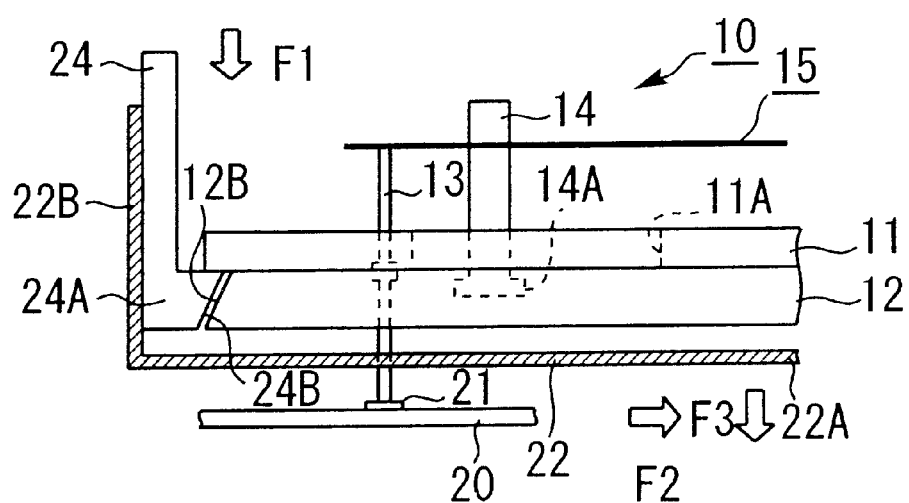
FIG. 20 shows a drive mechanism of the electric contact device according to the tenth embodiment.

In the tenth embodiment, the movable pole 14 is constructed so as to make substantially a half rotation around the contact lead 15. As shown in FIG. 19, the position at which the movable pole 14 causes the contact lead 15 to expand is indicated by dotted lines on the right side of the contact lead 15. In the present embodiment, the movable pole 14 is lowered while making a rotation such that the contact lead 15 is to be compressed while in an expanded state. As shown in FIG. 20, the drive mechanism 10 is constructed so as to have the tapered surfaces 12B and 24B and such that the base plate 12 can move parallel to and depart from the base plate 11. In association with lowering action of the actuation plate 24, the base plate 12 moves in direction F2 while lowering and departing from the base plate 11 in direction F3. The collar 14A of the movable pole 14 is embedded in the base plate 12, and the movable pole 14 moves and is lowered along with the base plate 12.

Figure 21A:
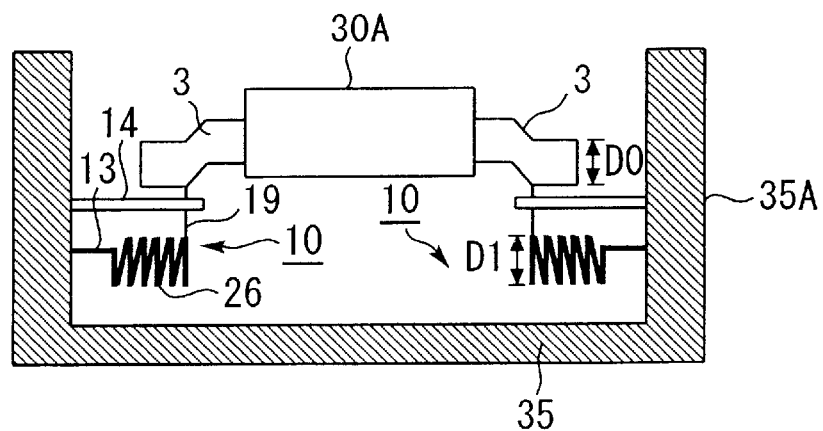
FIGS. 21A to 21C illustrate a socket using the electric contact device according to the tenth embodiment.
Figure 21B:
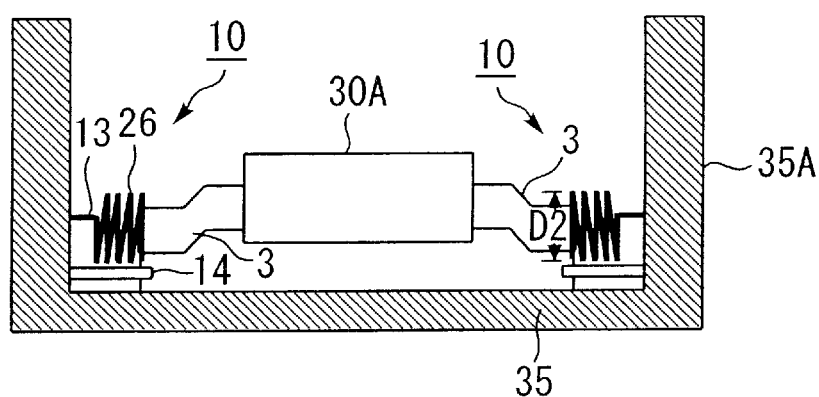
Figure 21C:
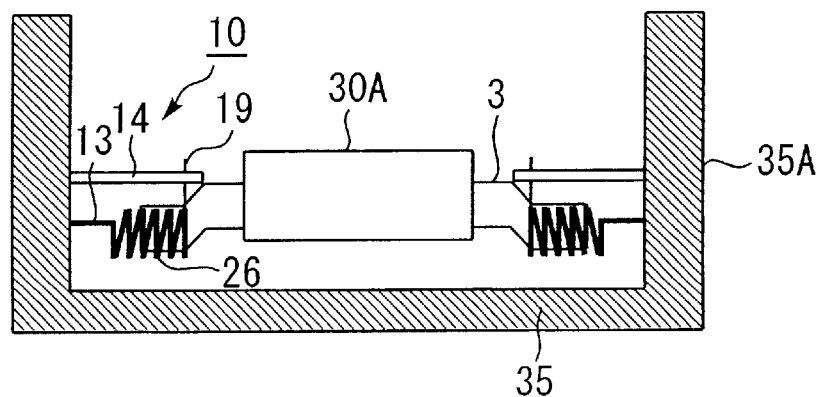
Figure 22:
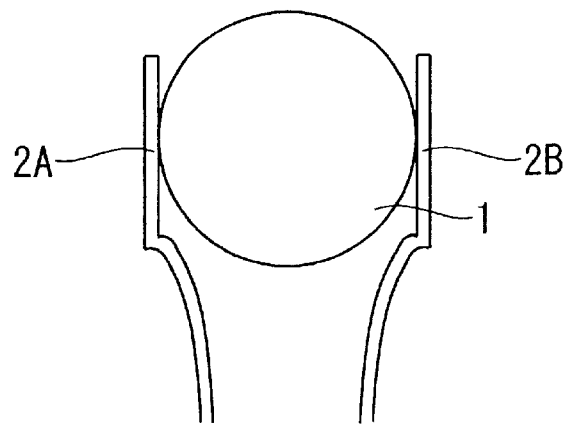
FIGS. 22 through 24 shows examples of conventional electric contact devices.
Figure 23:
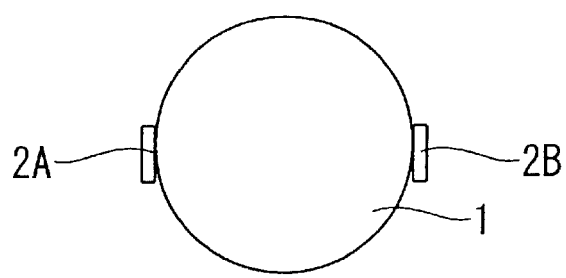
Figure 24:
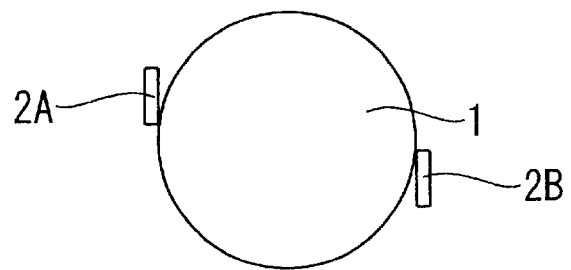

FIGS. 21A to 21C illustrate a socket 35 using the electric contact device according to the tenth embodiment. FIG. 21A shows a stationary state of the socket 35; FIG. 21B shows an expanded state of the socket 35; and FIG. 21C shows a contracted (contacted) state of the socket 35. A semiconductor device 30A employs a QFP package, and a plurality of strip contactors 3 are provided along each of the four sides of the square semiconductor device 30A. A plurality of contact mechanisms 10 corresponding to the contactors 3 are provided on side walls 35A of the socket 35. A drive mechanism for actuating the movable poles 14 of respective contact mechanisms 10 is incorporated into the side wall 35A. As in the case of the eighth embodiment, the movable poles 14 are moved along the corresponding guide grooves 11A in association with insertion of the semiconductor device 30A.

In the stationary state shown in FIG. 21A, the individual contact mechanisms 10 are located below the corresponding strip contactors 3. In the expanded state shown in FIG. 21B, the helical section 26 of each contact mechanism 10 is expanded such that the inside diameter D2 of the helical section 26 becomes greater than the width D0 of the contact 3. Further, in this state, the helical section 26 remains in a compressed state and is situated in a position closer to the inside surface of the side wall 35A. In the expanded state shown in FIG. 21B, the semiconductor device 30A is located lower than in the stationary state shown in FIG. 21A. The compressed helical section 26 is situated outside the contactor 3. During the course of returning from the expanded state shown in FIG. 21B to the stationary state shown in FIG. 21A, the helical section 26 enters the contracted state shown in FIG. 21C. The inside diameter of the helical section 26 of the contact lead 15 of each contact mechanism 10 is reduced, and the length of the helical section 26 becomes longer. As a result, the helical section 26 is wrapped around the exterior surface of the respective strip contactor 3. In this state, electrical contact is established.

Eleventh Embodiment

An eleventh embodiment is directed toward a method of testing semiconductor devices 30A and 30B, and the method is implemented in the following five steps.

In the first step, there are prepared test sockets 31 and 35 described in connection with the eighth, ninth, and tenth embodiments. In this step, the contact leads of the respective contact mechanisms 10 are held in a stationary state. The socket 31 or 35 includes a plurality of contact mechanisms 10, 101 or 102 corresponding to the ball contactors 1 of the semiconductor device 30 or 30A to be tested. Each of the contact mechanisms 10, 101 or 102 comprises a support pole, a movable pole, and a contact lead interposed therebetween. In association with the movement of the movable pole, the contact lead can enter an expanded state (a larger diameter) and a contracted state (a smaller diameter).

In the second step, the movable poles 14 of the respective contact mechanisms 10, 101 ord 102 of the socket 31 or 35 are moved, thereby bringing the contact leads into an expanded state so as to become greater in diameter than the contactors 1 or 3. In the eighth through tenth embodiments, the contact leads 15, 151 or 156 become greater in diameter than the contactors 1 or 3 by means of inserting the semiconductor device 30 or 30A into the socket 31 or 35.

In the third step, the contactor 1 or 3 is inserted into the ring-shape section 18 or the helical section 26 of the contact lead 15 while the contact lead 15 remains in an expanded state. In the case of the sockets described in connection with the eighth through tenth embodiments, insertion of the contactors into corresponding contact leads of the contact mechanisms is attained by the final phase of forcing a semiconductor device into the socket 31 or 35.

In the fourth step, contact leads of respective contact mechanisms are brought into a contracted state from an expanded state, thereby wrapping around corresponding contactors. In the case of the sockets described in connection with the eighth through tenth embodiments, wrapping contact leads around corresponding contactors is achieved during the course of contact leads being contracted under restoration force thereof after the force for pushing a semiconductor device into a socket has been released.

In the fifth step, a semiconductor device is subjected to a required test while the contact leads remain in a contracted (contacted) state. A required electric potential is supplied to respective contact leads, as a result of which a semiconductor device performs a predetermined function or operation. The result of operation is output from a certain contact lead, wherewith a determination is made as to whether or not the output is normal.

Other Aspects of the Invention

Now, in addition to the claimed aspects of the present invention, the other aspects can be summarized as follows.

In an aspect, the present invention provides an electric contact device comprising: a contact mechanism having a contact lead, which lead has a support end and a movable end and is formed from elastic conductive material so as to constitute a helical section therebetween; a drive mechanism for moving the movable end of the contact lead of the contact mechanism; and an electric circuit for supplying a required electric potential to the contact lead. Wherein, the drive mechanism moves the movable end such that the helical section of the contact lead of the contact mechanism enters an expanded state and assumes a larger diameter; a contactor is inserted into the helical section while the contact lead remains in an expanded state; and the contact lead comes into contact with the contactor while entering a contracted state such that the helical section assumes a smaller diameter.

In further aspect, the present invention provides a test socket for electrically testing a semiconductor device having a plurality of contactors, comprising: a plurality of contact mechanisms respectively having contact leads, each contact lead having a support end and a movable end provided on one surface of a base plate and being formed from elastic conductive material so as to constitute an annular section therebetween; a drive mechanism for commonly moving the movable ends of the respective contact mechanisms; and an electric circuit for supplying an electric potential required by the test to the contact leads of the respective contact mechanisms by way of the support poles thereof. Wherein, the drive mechanism moves the movable ends of the respective contact mechanisms such that the annular sections of the contact leads of the respective contact mechanisms enter an expanded state and assume a larger diameter; contactors are inserted into corresponding annular sections while the contact leads remain in an expanded state; and the contact leads come into contact with the contactors while entering a contracted state such that the annular sections assume a smaller diameter.

In further aspect, the present invention provides a test socket for electrically testing a semiconductor device having a plurality of contacts, comprising: a plurality of contact mechanisms respectively having contact leads, each contact lead having a support end and a movable end provided on one surface of a base plate and being formed from elastic conductive material so as to constitute a helical section therebetween; a drive mechanism for commonly moving the movable ends of the respective contact mechanisms; and an electric circuit for supplying an electric potential required of the test to the contact leads of the respective contact mechanisms by way of the support poles thereof. Wherein, the drive mechanism moves the movable ends of the respective contact mechanisms such that the helical sections of the contact leads of the respective contact mechanisms enter an expanded state and assume a larger diameter; contactors are inserted into corresponding helical sections while the contact leads remain in an expanded state; and the contact leads come into contact with the contactors while entering a contracted state such that the helical sections assume a smaller diameter.

In further aspect, the present invention provides a semiconductor module in which a semiconductor device having a plurality of contactors is mounted on a mount socket, the mount socket comprising: a plurality of contact mechanisms, each having a contact lead, and the contact lead having a support end and a movable end and being formed from elastic conductive material so as to constitute an annular section therebetween; a drive mechanism for commonly moving the movable ends of the contact leads of the contact mechanisms; and an electric wire connected to the contact leads of the respective contact mechanisms. Wherein, the drive mechanism moves the movable ends of the contact mechanisms such that the annular sections of the respective contact mechanisms enter an expanded state and assume a larger diameter; contactors are inserted into the respective annular sections while the contact leads remain in an expanded state; and the contact leads come into contact with the contactors while entering a contracted state such that the annular sections assume a smaller diameter.

In further aspect, the present invention provides a semiconductor module in which a semiconductor device having a plurality of contacts is mounted on a mount socket, the mount socket comprising: a plurality of contact mechanisms, each having a contact lead, and the contact lead having a support end and a movable end and being formed from elastic conductive material so as to constitute a helical section therebetween; a drive mechanism for commonly moving the movable ends of the contact leads of the contact mechanisms; and an electric wire connected to the contact leads of the respective contact mechanisms. Wherein, the drive mechanism moves the movable ends of the contact mechanisms such that the helical sections of the respective contact mechanisms enter an expanded state and assume a larger diameter; contactors are inserted into the respective helical sections while the contact leads remain in an expanded state; and the contact leads come into contact with the contactors while entering a contracted state such that the helical sections assume a smaller diameter.

In further aspect, the present invention provides a method of electrically testing a semiconductor device having a plurality of contactors, the method comprising the steps of: preparing a plurality of contact mechanisms, each having a contact lead, and the contact lead having a support end and a movable end and being formed from elastic conductive material so as to constitute an annular section therebetween; bringing the contact leads of the respective contact mechanisms into an enlarged state such that the annular sections assume a larger diameter and inserting the contactors of the semiconductor device into corresponding annular sections of the contact leads of the respective contact mechanisms; and bringing the contact leads of the respective contact mechanisms into a contracted state such that the annular sections assume a smaller diameter and bringing the contact leads of the contact mechanisms into contact with the contactors of the semiconductor device, thus testing the semiconductor device.

In further aspect, the present invention provides a method of electrically testing a semiconductor device having a plurality of contacts, the method comprising the steps of: preparing a plurality of contact mechanisms, each having a contact lead, and the contact lead having a support end and a movable end and being formed from elastic conductive material so as to constitute a helical section therebetween; bringing the contact leads of the respective contact mechanisms into an enlarged state such that the helical sections assume a larger diameter and inserting the contactors of the semiconductor device into corresponding helical sections of the contact leads of the respective contact mechanisms; and bringing the contact leads of the respective contact mechanisms into a contracted state such that the helical sections assume a smaller diameter and bringing the contact leads of the contact mechanisms into contact with the contactors of the semiconductor device, thus testing the semiconductor device.

Now, the effects and advantages of the present invention may be summarized as follows.

As has been described above, in an electric contact device according to the present invention, a movable end is moved such that a contact lead of a contact mechanism having a annular section is brought into an expanded state in which the diameter of the annular section increases. A contactor is inserted into the annular section in the expanded state. In a contracted state in which the diameter of the annular section becomes smaller, the contact lead comes into contact with the contactor. Consequently, the contact lead can be brought into reliable contact with the contactor along the annular section while ensuring a large contact area. As a result, contact resistance is reduced, thereby attaining better electrical contact.

In another aspect, the annular section is formed so as to assume a partially-broken circular shape, whereby the contact lead can come into reliable contact with a ball contactor over a large contact area.

In another aspect, the annular section is formed so as to assume a corrugated shape, whereby the contact area between the ball contactor and the lead contact can be increased to a much greater extent.

In another aspect, a support end of the contact lead is supported by a support pole attached to base plates, and a movable end of the contact lead is movable along a guide groove formed in the base plates. So long as the movable pole is moved by means of a drive mechanism, the contact lead of simple construction can be brought into reliable contact with a contactor.

In another aspect, the support end, the movable end, and the annular section of the contact lead are arranged within a plane substantially parallel to the base plates. As a result, the contact lead can be brought into contact with a contactor over a much larger contact area while the height of the contact lead can be reduced.

In another aspect, the support end and the movable end are arranged so as to differ in level from each other while being disposed substantially parallel. As a result, the contact lead can be brought into contact with the exterior surface of a ball contactor over a much wider contact area.

In another aspect, the movable end is arranged so as to move in both vertical and horizontal directions in conjunction with the base plates. Similarly, the contact lead can be brought into contact with the exterior surface of a ball contactor over a much wider contact area.

In another aspect, a plurality of contact leads are provided between a common support pole and a common movable pole. Consequently, the contact lead can be brought into reliable contact with a ball contactor over a much wider contact area.

In another aspect, there is provided a drive mechanism for simultaneously actuating movable ends of contact leads of respective contact mechanisms spaced apart from each other and located in a position above the base plates. As a result, a mechanism for actuating contact leads of respective contact mechanisms can be constructed simply.

In another aspect, the movable pole engaged with the movable end of the contact lead of each of the contact mechanisms is moved along a guide groove formed in the base plates. The performance required of the drive mechanism for actuating the contact mechanisms is merely movement. Therefore, the drive mechanism can be constructed more simply.

In another aspect, each of contact mechanisms has a plurality of contact leads provided between a common support pole and a movable pole. Further, contact leads of one contact mechanism and contact leads of another adjacent contact mechanism are arranged in a staggered manner parallel to the base plates. As a result, contact leads of respective contact mechanism can come into reliable contact with a contactor over a much wider contact area.

In another aspect, there is provided a drive mechanism for simultaneously actuating movable ends of contact leads of first and second contact mechanisms which are positioned on the base plates and spaced apart from each other. As a result, a mechanism for actuating contact leads of respective contact mechanisms can be constructed simply.

In another aspect, each of first contact mechanisms has a plurality of contact leads provided between a common support pole and a common movable pole, and each of second contact mechanisms has a plurality of contact leads provided between a common support pole and a common movable pole. The first contact mechanism and the second contact mechanism are arranged adjacent to each other such that the contact leads of the first contact mechanism and the contact leads of the second contact mechanism are arranged parallel in a staggered pattern. As a result, the first and second contact mechanisms can be placed closely to each other, thereby reducing the space required by the contact mechanisms.

In another aspect, there is employed a contact lead comprising a support end, a movable end, and a helical section interposed therebetween. As a result, the contact lead can be brought into contact with a contactor by way of the helical section and over a wider contact area.

In another aspect, there is provided a test socket, for use of a semiconductor device having a plurality of contactors, comprising a plurality of contact mechanisms provided on base plates. Each contact mechanism has a contact lead, and the contact lead has an annular section, wherein movable poles of respective contact mechanisms are actuated simultaneously. As a result, a drive mechanism is simplified, and the contact leads can be brought into reliable contact with corresponding contactors over a much wider contact area.

In another aspect, there is provided a test socket comprising a plurality of contact mechanisms provided on base plates. Each contact mechanism has a contact lead, and the contact lead has a helical section. The helical section can ensure a much wider contact area between the contact mechanism and a contact.

In another aspect, there is provided a semiconductor module comprising a semiconductor device mount socket, which includes a plurality of contact mechanisms provided on base plates. Each contact mechanism has a contact lead, and the contact lead has an annular section, wherein movable poles of the contact mechanisms are actuated simultaneously. As a result, a drive mechanism for actuating the movable poles is simplified, and the contact mechanisms can be brought into reliable contact with corresponding contactors over a much wider contact area.

In another aspect, the semiconductor module employs amount socket which is formed by means of placing a plurality of contact mechanisms on base plates, wherein the contact mechanism has a contact lead, and the contact lead has a helical section. In each contact mechanism, the helical section can ensure a wider contact area.

In another aspect, there is provided a test method of subjecting to a test of a semiconductor device having a plurality of contacts, through use of a plurality of contact mechanisms having contact leads, each contact lead having an annular section. In the test method, a contactor is inserted into a corresponding contact lead while the contact lead is expanded, and the contact lead is brought into contact with the periphery of the corresponding contactor while the contact lead is in a contracted state (smaller diameter). Each contactor can be brought into reliable contact with the corresponding contact lead over a much wider contact area, thereby enabling testing of the semiconductor device.

In another aspect, there is provided a test method of subjecting to a test of a semiconductor device having a plurality of contacts, through use of a plurality of contact mechanisms, each contact mechanism having a contact lead including a helical section. The helical section ensures contact over a much wider area.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-258580, filed on Aug. 29, 2000 including specification, claims, drawings and summary, on which the Convention priority of the present application is based, are incorporated herein by reference in its entirety.

What is claimed is:

1. An electric contact device comprising:
   a contact mechanism having a contact lead, said contact lead has a support end and a movable end and is formed from elastic conductive material so as to constitute a ring-shape section therebetween;
   a drive mechanism for rotating the movable end of the contact lead of the contact mechanism; and
   an electric circuit for supplying an electric potential required by the contact lead of the contact mechanism, wherein the drive mechanism moves the movable end such that the ring-shape section of the contact lead of the contact mechanism enters an expanded state and assumes a larger diameter; a contactor is adapted to be inserted into the ring-shape section while the contact lead remains in an expanded state; and the contact lead is adapted to come into contact with the contactor while entering a contracted state such that the ring-shape section assumes a smaller diameter.

2. The electric contact device according to claim 1, wherein the ring-shape section is formed so as to assume an annular portion partially.

3. The electric contact device according to claim 1, wherein the ring-shape section assumes a corrugated shape.

4. An electric contact device comprising:
   a contact mechanism having a contact lead, said contact lead has a support end and a movable end and is formed from elastic conductive material so as to constitute a ring-shape section therebetween;
   a drive mechanism for moving the movable end of the contact lead of the contact mechanism; and an electric circuit for supplying an electric potential required by the contact lead of the contact mechanism, wherein the drive mechanism moves the movable end such that the ring-shape section of the contact lead of the contact mechanism enters an expanded state and assumes a larger diameter; a contactor is adapted to be inserted into the ring-shape section while the contact lead remains in an expanded state; and the contact lead is adapted to come into contact with the contactor while entering a contracted state such that the ring-shape section assumes a smaller diameter, wherein the support end is supported by a support pole attached to a base plate; the movable end is coupled to a movable pole which can move along a guide groove formed in the base plate; and the drive mechanism moves the movable pole, to thereby actuate the movable end.

5. The electric contact device according to claim 4, wherein the support end, the movable end, and the ring-shape section are placed within a plane substantially parallel to the base plate.

6. The electric contact device according to claim 4, wherein the support end and the movable end are placed substantially parallel to the base plate so as to differ in level from each other.

7. The electric contact device according to claim 4, wherein the movable pole also moves in the direction perpendicular to the base plate.

8. The electric contact device according to claim 4, wherein the contact mechanism has a plurality of contact leads; support ends of the respective contact leads are commonly supported by the support pole; and movable ends of the respective contact leads are commonly actuated by the movable pole.

9. An electric contact device comprising:
a plurality of contact mechanisms which are spaced apart from each other, each contact mechanism having a contact lead, and the contact lead having a support end and a movable end and being formed from elastic conductive material so as to constitute a ring-shape section therebetween;
a drive mechanism for commonly rotating the movable ends of the contact leads of the contact mechanisms; and
an electric circuit for supplying an electric potential required by the contact leads of the contact mechanisms, wherein the drive mechanism moves the movable ends of the contact leads of the contact mechanisms such that the ring-shape sections enter an expanded state and assume a larger diameter; contactors are adapted to be inserted into the respective ring-shape sections while the contact leads remain in an expanded state; and the contact leads are adapted to come into contact with the respective contactors while entering a contracted state such that the ring-shape sections assume a smaller diameter.

10. An electric contact device comprising:
a plurality of contact mechanisms which are spaced apart from each other and placed on a base plate, each contact mechanism having a contact lead, and the contact lead having a support end and a movable end and being formed from elastic conductive material so as to constitute a ring-shape section therebetween;
a drive mechanism for commonly moving the movable ends of the contact leads of the contact mechanisms; and
an electric circuit for supplying an electric potential required by the contact leads of the contact mechanisms, wherein the drive mechanism moves the movable ends of the contact leads of the contact mechanisms such that the ring-shape sections enter an expanded state and assume a larger diameter; contactors are adapted to be inserted into the respective ring-shape sections while the contact leads remain in an expanded state; and the contact leads are adapted to come into contact with the respective contactors while entering a contracted state such that the ring-shape sections assume a smaller diameter, wherein the support ends of the contact leads of the contact mechanisms are supported by corresponding support poles attached to the base plate; the movable ends of the contact leads of the contact mechanisms are coupled to corresponding movable poles which can move along a corresponding guide groove formed in the base plate; and the drive mechanism moves the movable poles, to thereby commonly actuate the movable ends of the contact mechanisms.

11. The electric contact device according to claim 10, wherein at least one of the contact mechanisms has a plurality of contact leads which are commonly supported by the corresponding support pole and are commonly coupled to the corresponding movable pole, and the contact leads are placed substantially parallel to the base plate so as to differ in level from each other.

12. An electric contact device comprising:
first and second contact mechanisms which are spaced apart from each other, each of the first and second contact mechanisms having a contact lead, and the contact lead having a support end and a movable end and being formed from elastic conductive material so as to constitute a ring-shape section therebetween;
a drive mechanism for commonly rotating the movable ends of the contact leads of the first and second contact mechanisms; and
an electric circuit for supplying an electric potential required by the contact leads of the first and second contact mechanisms, wherein the drive mechanism moves the movable ends of the contact leads of the first and second contact mechanisms such that the ring-shape sections enter an expanded state and assume a larger diameter; contactors are adapted to be inserted into the respective ring-shape sections while the contact leads remain in an expanded state; and the contact leads are adapted to come into contact with the respective contactors while entering a contracted state in which the ring-shape sections assume a smaller diameter.

13. An electric contact device comprising:
first and second contact mechanisms which are spaced apart from each other and placed on a base plate, each of the first and second contact mechanisms having a contact lead, and the contact lead having a support end and a movable end and being formed from elastic conductive material so as to constitute a ring-shape section therebetween;
a drive mechanism for commonly moving the movable ends of the contact leads of the first and second contact mechanisms; and
an electric circuit for supplying an electric potential required by the contact leads of the first and second contact mechanisms, wherein the drive mechanism moves the movable ends of the contact leads of the first and second contact mechanisms such that the ring-shape sections enter an expanded state and assume a larger diameter; contactors are adapted to be inserted into the respective ring-shape sections while the contact leads remain in an expanded state; and the contact leads are adapted to come into contact with the contactors while entering a contracted state in which the ring-shape sections assume a smaller diameter, wherein the first contact mechanism has a plurality of contact leads which are commonly supported by a first support pole and are commonly coupled to a first movable pole; the second contact mechanism has a plurality of contact leads which are commonly supported by a second support pole and are commonly coupled to a second movable pole; and the contact leads of the first and second contact mechanisms are placed substantially parallel to the base plate so as to differ in level from each other.

14. An electric contact device comprising:

a conductive contact lead including a first end and a second movable end formed so as to constitute a ring-shape section therebetween;

a drive mechanism for moving the second movable end so as to increase the distance between the first end and second movable end such that the ring-shape section enters an expanded state and assumes a larger diameter;

a contactor is adapted to be inserted into the ring-shape section while the contact lead remains in an expanded state; and the contact lead is adapted to come into contact with the contactor while entering a contracted state such that the ring-shape section assumes a smaller diameter, wherein said drive mechanism includes a connecting line extending from said second movable end.

15. The electric contact device according to claim 14, wherein said drive mechanism further includes a movable pole coupled to said connecting line.

16. The electric contact device according to claim 15, wherein said movable pole and said connecting line are configured to be movable relative to each other.

* * * * *